(12) United States Patent
Dumas et al.

(10) Patent No.: US 8,365,056 B2
(45) Date of Patent: Jan. 29, 2013

(54) RECEIVER EQUIPPED WITH A TRELLIS VITERBI DECODER

(75) Inventors: Pierre-Yves Dumas, Guilherand-Granges (FR); Yves Clauzel, Montelimar (FR); Jean-Michel Perre, St Peray (FR)

(73) Assignee: Thales, Neuilly-sur-Seine (FR)

( * ) Notice: Subject to any disclaimer, the term of this patent is extended or adjusted under 35 U.S.C. 154(b) by 420 days.

(21) Appl. No.: 12/796,272

(22) Filed: Jun. 8, 2010

(65) Prior Publication Data
US 2010/0313103 A1 Dec. 9, 2010

(30) Foreign Application Priority Data

Jun. 9, 2009 (FR) ...................................... 09 02782

(51) Int. Cl.
*H03M 13/03* (2006.01)

(52) U.S. Cl. ........................................ 714/795; 714/792

(58) Field of Classification Search .................. 375/260, 375/262, 265; 714/780, 792, 795, 796
See application file for complete search history.

(56) References Cited

U.S. PATENT DOCUMENTS

| | | | |
|---|---|---|---|
| 5,546,396 A | 8/1996 | Clauzel et al. | |
| 5,887,036 A | 3/1999 | Temerinac | |
| 6,477,680 B2 * | 11/2002 | Mujtaba | 714/795 |
| 6,597,743 B1 * | 7/2003 | Khayrallah et al. | 375/265 |
| 7,613,989 B2 * | 11/2009 | Kiefer et al. | 714/795 |
| 7,620,877 B2 * | 11/2009 | Vithanage et al. | 714/780 |
| 7,636,400 B2 * | 12/2009 | Thomson et al. | 375/260 |
| 8,111,767 B2 * | 2/2012 | Gezici et al. | 375/262 |
| 2006/0195773 A1 | 8/2006 | Pisek et al. | |
| 2009/0259707 A1 | 10/2009 | Martin et al. | |

FOREIGN PATENT DOCUMENTS

DE 201 09 857 U1 10/2001

OTHER PUBLICATIONS

S.S. Rattan, et al., "Design of Microprocessor Based Viterbi Decoder", Student's Journal of the Institution of Electronics and Telecommunication Engineers, New Dehli, IN, vol. 34, Nos. 3/04, Jul. 1, 1993, pp. 183-194.

* cited by examiner

*Primary Examiner* — David Ton
(74) *Attorney, Agent, or Firm* — Baker & Hostetler LLP

(57) ABSTRACT

A receiver of a digital signal equipped with an N-state weighted-decision trellis Viterbi decoder, the signal received including a series of symbols, is provided. The receiver comprises a programmable logic circuit that includes a source memory A and a destination memory B each comprising N rows and M+L columns respectively allocated to M fixed fields for describing the trellis, and to L variable fields, and an operator able to calculate the variable fields of a memory as a function of the fixed fields of the said memory, of the symbols received and of the variable fields of the other memory and able to reverse the role of the source memory and destination memory.

13 Claims, 12 Drawing Sheets

Memory B (source)

RECEIVER EQUIPPED WITH A TRELLIS VITERBI DECODER

CROSS-REFERENCE TO RELATED APPLICATIONS

This application claims priority to foreign Patent Application FR 09 02782, filed on Jun. 9, 2009, the disclosure of which is incorporated herein by reference in its entirety.

FIELD OF THE INVENTION

The field of the invention is that of the reception of a digital signal coded according to a Viterbi coding; it more particularly involves the decoding of this signal received, according to a trellis Viterbi decoding.

BACKGROUND OF THE INVENTION

Much used in the data communications field, the coding of transmitted data makes it possible to greatly improve the resistance to errors of digital transmissions by adding cleverly calculated redundancy symbols. These redundancy symbols allow the receiver to detect and to correct errors without it being necessary to ask the sender to retransmit the data. This is particularly beneficial when retransmissions are expensive or indeed impossible, as for example in the field of radio transmissions and more specifically when these transmissions are noisy as is the case for satellite transmissions. Several types of error correcting codings exist, including block coding and convolutional coding, thus called since it is based on convolving the input data with the impulse responses of the coder. Viterbi coding is a convolutional coding.

The bits to be sent are introduced into a shift register of length lc−1 so as to be coded as illustrated in FIG. 1, lc being called the constraint length. One also speaks of a register with lc−1 stages.

A coder is defined by polynomials and it comprises K memory registers, K being the number of delay lines (constituting the shift register) necessary to implement the polynomials. We have lc=K.

A Viterbi coder whose implementation is represented in FIG. 2 is defined by the following two polynomials $G1(x)$, $G2(x)$:

$$G1(x)=x^6+x^5+x^4+x^3+1$$

$$G2(x)=x^6+x^4+x^3+x^2+1$$

A convolutional coder is often considered to be a finite state machine. Each state corresponds to a value of the register of the coder. On the basis of an input bit (1 or 0), as a function of the state of the input register of the coder, two permitted states, i.e. two possible transitions, the others being prohibited, are obtained at the output of the coder (by shifting the bits of the input register and then by taking the input bit as the missing bit), and so on and so forth. These state transitions are represented by arcs on a diagram called a trellis. The states of the coder are represented by the nodes of the trellis. An exemplary elementary lattice of a trellis for lc=3 has been represented in FIG. 3. An elementary lattice also called an elementary trellis illustrates for all the starting states the permitted transitions (or arcs) between a starting state and a finishing state. The solid lines correspond to the sending of a "1," the dashed lines correspond to the sending of a "0"; this convention is retained subsequently.

A trellis also makes it possible to represent the coding: this is obtained by labeling the arcs of the trellis as a function of this coding. Represented in FIG. 5 is an exemplary trellis corresponding to a coding whose implementation is represented in FIG. 4 and which is defined by the polynomials:

$$G1(x)=x^2+x+1$$

$$G2(x)=x^2+1$$

The labels on the arcs of the lattice represent the pair of symbols (G1, G2) sent as output from the coder; they have been obtained in the following manner, G1 and G2 being calculated modulo 2:

starting from the state 00, by introducing the bit 1, we obtain G1(1)=1 and G2(1)=1 starting from the state 00, by introducing the bit 0, we obtain G1(0)=0 and G2(0)=0 starting from the state 01, by introducing the bit 1, we obtain G1(1)=0 and G2(1)=0 starting from the state 01, by introducing the bit 0, we obtain G1(0)=1 and G2(0)=1 starting from the state 10, by introducing the bit 1, we obtain G1(1)=0 and G2(1)=1 starting from the state 10, by introducing the bit 0, we obtain G1(0)=1 and G2(0)=0 starting from the state 11, by introducing the bit 1, we obtain G1(1)=1 and G2(1)=0 starting from the state 11, by introducing the bit 0, we obtain G1(0)=0 and G2(0)=1.

Starting from a delay line initialized to "0," the sequence 1001 is sent: the path represented in FIG. 6 is manifested by the sending of the sequence of symbols, 11 10 11 11 generated by the coding of the previous example.

Each path of the trellis corresponds to a valid sequence of coded bits; and conversely, any valid sequence can be represented by a path.

Reception side, the data must therefore be decoded. When an error arises generated for example by the transmission channel (11 00 11 11 is received instead of 11 10 11 11), the receiver will receive a symbol corresponding to a prohibited transition, which is not on a possible path. The task of the decoder is then to find a path which is as close as possible to the path of the sequence of bits sent.

If the coder is of relatively trivial implementation, the decoder (embedded in the receiver) requires more calculations.

The Viterbi decoder traditionally uses the trellis algorithm which allows optimal detection in terms of performance and computational load in calculating the error symbols. Numerous hardware or software implementations of this decoder with or without manual parameterization are available.

In general, the data received by the receiver are noisy analogue data. For example, the bit 1 sent becomes 0.8 on reception. A coding can then be introduced on reception, to take into consideration the fact that certain data received are more certain than others: according to this so-called weighted-decision or "soft decision" coding, each data item received is coded on n bits (in general n=3 which corresponds to a weighting varying between 0 and 7). One then speaks of a weighted-decision Viterbi decoder.

A firm- or binary-decision, or "hard decision," coding refers to a coding without this weighting, that is to say weighted with 0 bits (n=1): this is ultimately a particular case of weighted-decision coding.

The use of the "soft decision" mechanism makes it possible to improve the binary error rate (BER) reduction performance.

The various implementations of this algorithm make it possible either to favor speed of the algorithm (adapted to a high data throughput) by parallelizing the resources, or conversely to optimize the use of the resources (silicon size for hardware implementation, load rate for software implementation), to the detriment of the throughput. In the case of GNSS receivers, the throughput remains low (a few hundred Hertz at the maximum) and resource optimization is therefore of relevance.

SUMMARY OF THE INVENTION

Embodiments of the present invention advantageously provide a particular hardware implementation of a weighted-decision trellis Viterbi decoder, optimizing the necessary hardware resources and notably adapted to the GNSS requirement. It is made possible by the implementation of a specific decoding method; the subject of the invention is also this method.

More precisely, one embodiment of the present invention provides a receiver of a digital signal equipped with an N-state weighted-decision trellis Viterbi decoder, in which the signal received comprises a series of symbols. The receiver comprises a programmable logic circuit that includes:

a source memory A and a destination memory B each comprising N rows and M+L columns respectively allocated to M fixed fields for describing the trellis, and to L variable fields, and an operator able to calculate the variable fields of a memory as a function of the fixed fields of the said memory, of the symbols received and of the variable fields of the other memory and to reverse the role of the source memory and destination memory.

According to a characteristic of the invention, the trellis being established on the basis of an elementary trellis comprising N starting states and N finishing states, each starting state being linked to two finishing states by labeled arcs, the fixed fields comprise two destination address fields, one per finishing state and two fields of labels of the corresponding arcs; the variable fields comprise a field of distance aggregated as a function of the labels of the elementary trellis and of the symbols received, and a sequence field of the S last decoded bits.

According to another characteristic of the invention, N being equal to $2^{lc}$, lc being the constraint length of the coder, the destination addresses are defined on lc bits.

Preferably, M=4 and L=2 or 3.

The weighted decision being coded on n bits, the labels are then defined on n bits.

According to a characteristic of the invention, the variable fields furthermore comprise a field indicating for each row of the memory whether the aggregated distance has already been calculated for the symbol received. This indicator field is for example defined on one bit.

This receiver is typically a GNSS receiver.

Another embodiment of the present invention provides a method for receiving a digital signal by means of a receiver such as previously described, that comprises a decoding step that includes a step of processing each symbol received that includes, for each row of the source memory, the following sub-steps for each of the two addresses of this row:

calculation of the distance between the symbol received and the label of the label field associated with this address, calculation of the aggregated distance from the destination memory to this address on the basis of the said distance and of the aggregated distance of the said row of the source memory, this distance, termed last distance, being associated with a decoded sequence, and if an aggregated distance, termed previous aggregated distance, has already been calculated at this address, choice for this address of the smallest aggregated distance between this previous aggregated distance and the last aggregated distance, and updating of the sequence decoded by the sequence associated with the chosen aggregated distance.

According to a characteristic of the invention, at the end of the step of processing the symbol received, the role of the source memory and destination memory is reversed.

At the end of the step of processing the symbol received, the aggregated distance of each row of the destination memory is advantageously normalized to avoid an overflow of the aggregated-distance field. This normalization consists for example in subtracting the smallest aggregated distance from all the aggregated distances.

According to a characteristic of the invention, the value of the indicator of the indicator field reverses when the aggregated distance has already been calculated and at the end of the step of processing the symbol received, this indicator is reinitialized for each row of the memory.

This method makes it possible to define a part of the architecture of a programmable logic circuit (ASIC or FPGA), which part is dedicated to the decoding of the messages sent by the satellites of a GNSS positioning system (Galileo, EGNOS, GPS, etc.). To reduce the bit error rate due to transmission, these messages are coded at the satellite level in accordance with the Viterbi algorithm. Offloading the decoding to an existing signal processing microchip makes it possible to release software resources in the processors of the GNSS receivers.

This method thus makes it possible to optimize the size and therefore the volume and consumption of the component, which may be done in so far as the GNSS data throughput problem is hardly a constraint.

BRIEF DESCRIPTION OF THE DRAWINGS

Other characteristics and advantages of the invention will become apparent on reading the detailed description which follows, given by way of non-limiting example and with reference to the appended drawings in which.

DETAILED DESCRIPTION

Figure 1:
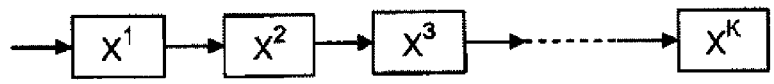
FIG. 1 schematically represents a shift register with K−1 stages.
Figure 2:
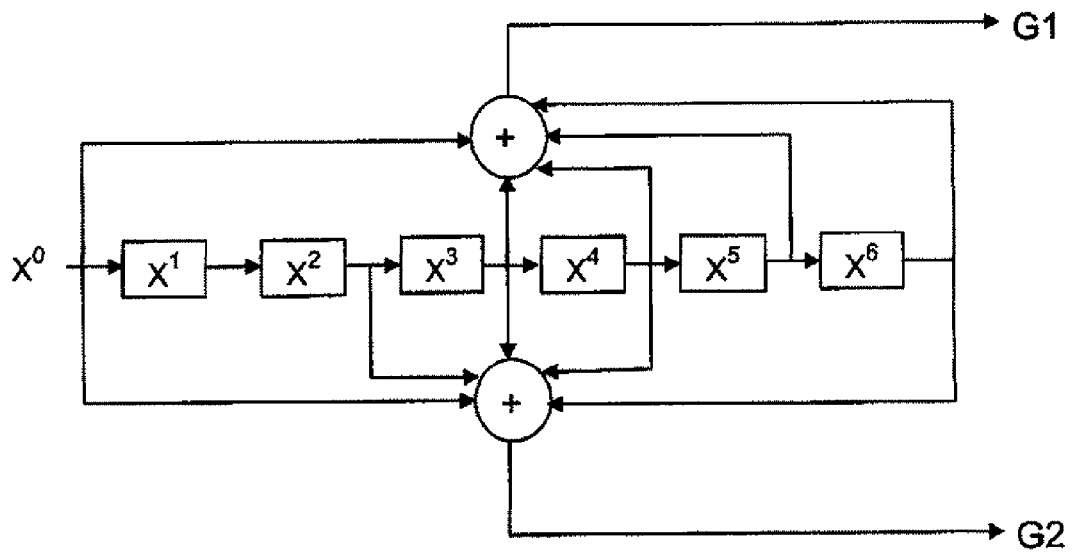
FIG. 2 schematically represents the implementation of a Viterbi coder.
Figure 3:
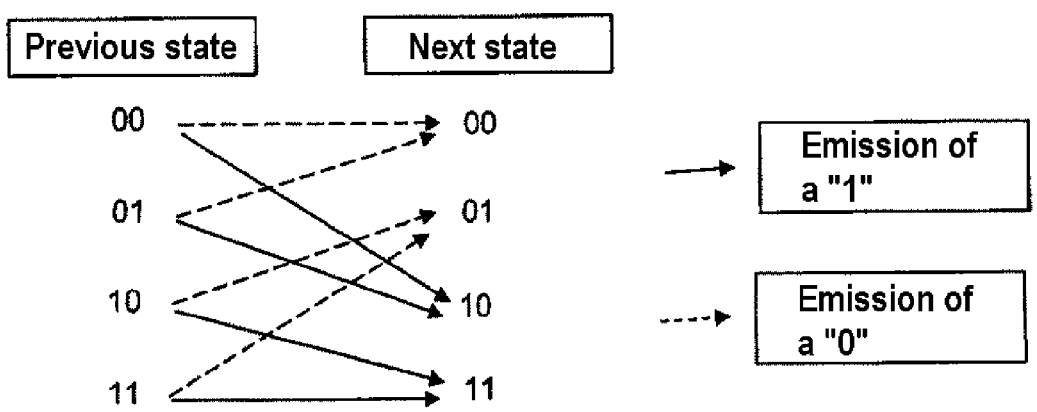
FIG. 3 schematically represents an elementary lattice of a trellis for K=3.
Figure 4:
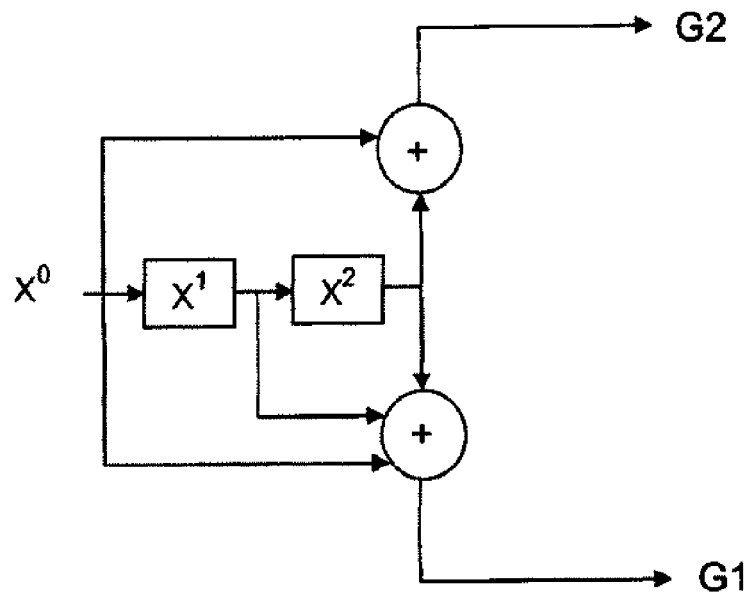
FIG. 4 schematically represents the implementation of an exemplary coder.
Figure 5:
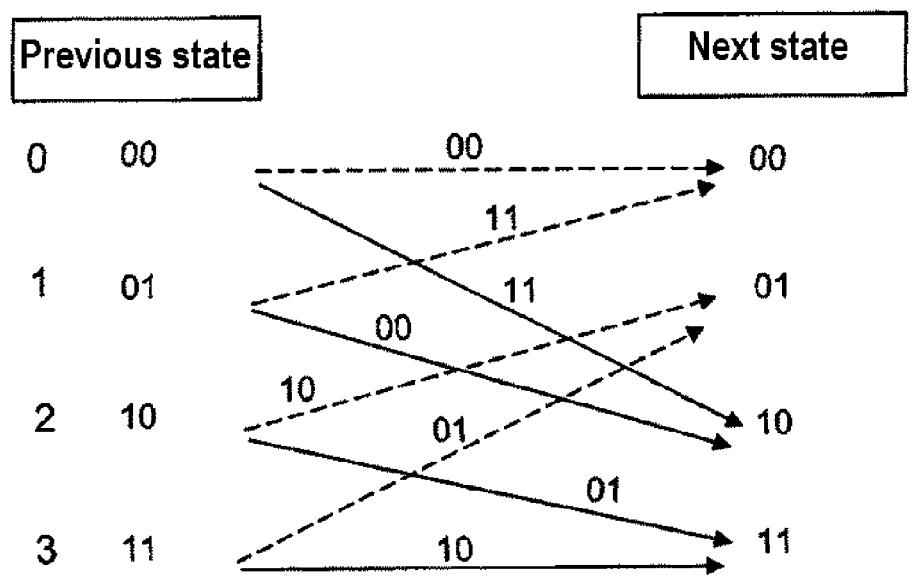
FIG. 5 schematically represents the elementary trellis (or elementary lattice) of the coder of FIG. 4, FIG. 6 schematically represents the path for a sent sequence equal to 1001 on the basis of the trellis of FIG. 4, FIGS. 7a to 7c schematically represent an exemplary construction according to the invention, of the trellis associated with the decoding according to the elementary lattice of FIG. 5, of the sequence of symbols received 11 00 11 11, FIGS. 8a to 8c schematically represent the initialization of the memories A and B (FIG. 8a), their updating induced by the reception of the first pair of symbols (11) of the example considered (FIG. 8b, 8c), according to the invention, FIGS. 9a to 9c schematically represent the updating of the memories A and B induced by the reception of the 2nd pair of symbols (00) of the example considered, according to the invention, FIGS. 10a to 10f schematically represent the updating of the memories A and B induced by the reception of the 3rd pair of symbols (11) of the example considered, according to the invention, FIGS. 11a to 11f schematically represent the updating of the memories A and B induced by the reception of the 4th pair of symbols (11) of the example considered, according to the invention, FIG. 12 schematically represents the implementation according to the invention of the decoding method presented.
Figure 6:
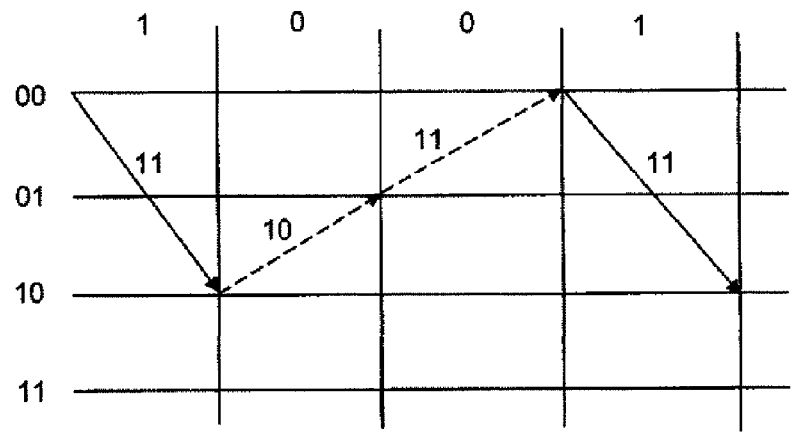

The invention will now be described with reference to the drawing figures, in which like reference numerals refer to like parts throughout.

Figure 7A:
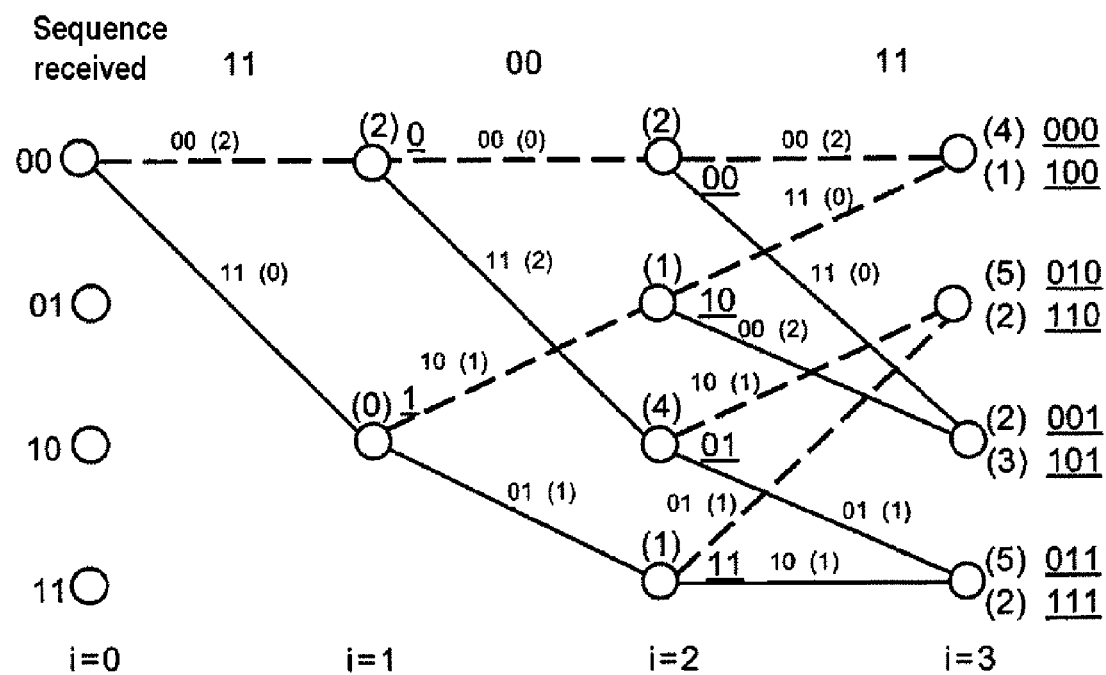
Figure 7B:
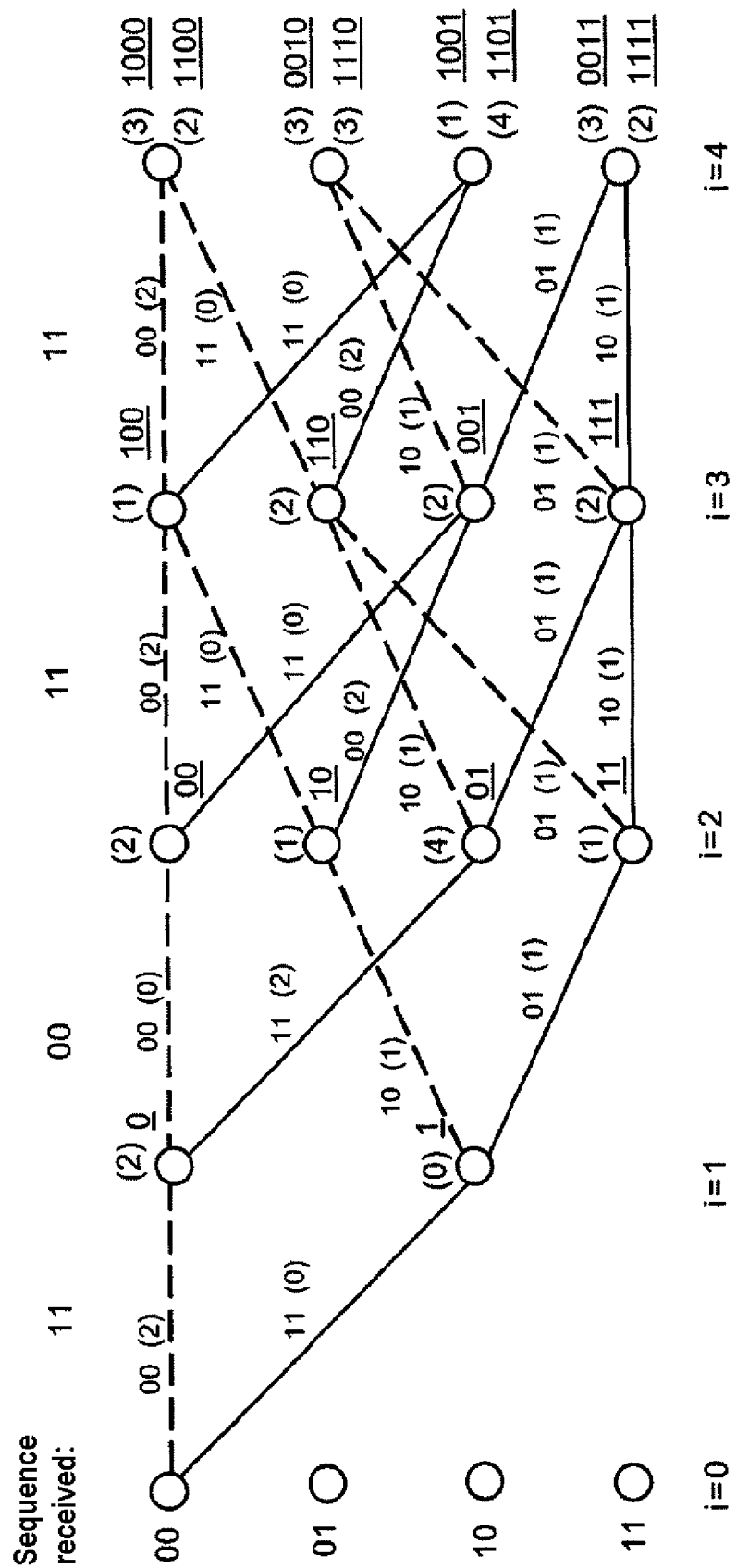
Figure 7C:
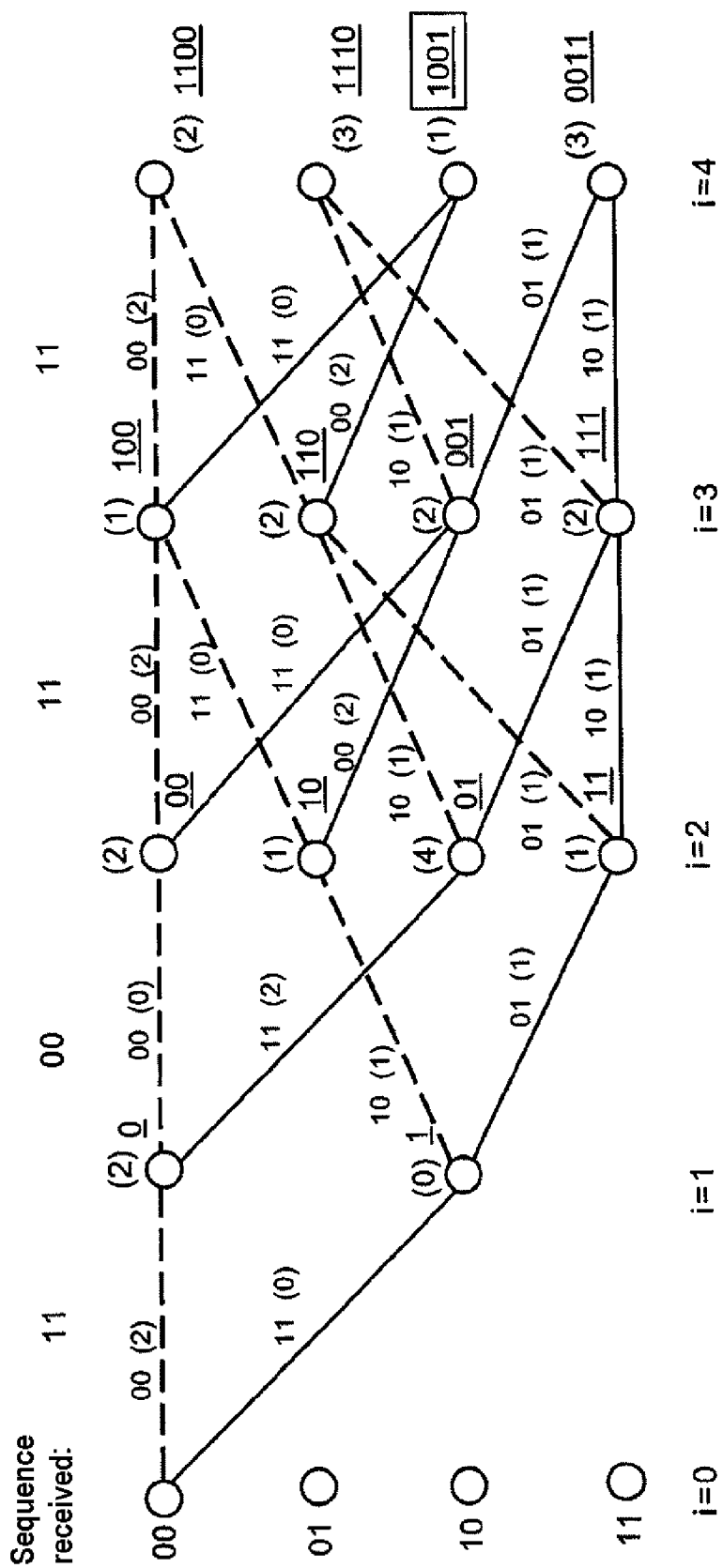

The procedure of the Viterbi decoding method on which the hardware implementation of the decoder according to the invention is based will firstly be described. This procedure, described in relation to FIGS. 7a to 7c, is carried out on the same example as previously: the received sequence to be decoded is 11 00 11 11. The symbols are received in pairs.

The first symbol received is the pair 11. Knowing that the state 00 (initialization state with i=0) is the starting state, the following two possible states are 00 or 10. By transferring the labels of the arcs of the elementary trellis to each arc, we have for column i=1:
  a distance (indicated between parentheses alongside the labels) equal to 2 by comparing the sequence received 11 with 00, an aggregated distance (indicated between parentheses on each node) also equal to 2, the corresponding decoded bit (underlined alongside each node) being 0,
  a distance of 0 by comparing the sequence received 11 with 11, an aggregated distance also equal to 0, the corresponding bit being 1.

The second symbol received is the pair 00. Starting from one of the two possible states, namely the state 00, we have for column i=2:
  a distance equal to 0 by comparing the sequence received 00 with 00, an aggregated distance which remains equal to 2, the corresponding bit being 0, the sequence of decoded bits (underlined alongside each node) being 00,
  a distance of 2 by comparing the sequence 00 with 11, an aggregated distance equal to 4, the corresponding bit being 1, the sequence of decoded bits being 01.

Starting from the other possible state, namely the state 10, we again have for i=2:
  a distance equal to 1 by comparing the sequence 00 with 01, an aggregated distance equal to 1, the corresponding bit being 1, the sequence of decoded bits being 11,
  a distance of 1 by comparing the sequence 00 with 10, an aggregated distance equal to 1, the corresponding bit being 0, the sequence of decoded bits being 10.

The third symbol received is the pair 11. Starting from one of the four possible states, namely the state 00, we have for column i=3:
  a distance equal to 2 by comparing the sequence received 11 with 00, an aggregated distance equal to 4, the corresponding bit being 0, the sequence of decoded bits being 000,
  a distance of 0 by comparing the sequence 11 with 11, an aggregated distance equal to 2, the corresponding bit being 1, the sequence of decoded bits being 001.

Starting from another possible state, namely the state 01, we have for column i=3:
  a distance equal to 0 by comparing the sequence 11 with 11, an aggregated distance equal to 1, the corresponding bit being 0, the sequence of decoded bits being 100,
  a distance of 2 by comparing the sequence 11 with 00, an aggregated distance equal to 3, the corresponding bit being 1, the sequence of decoded bits being 101.

Starting from another possible state, namely the state 10, we have for column i=3:
  a distance equal to 1 by comparing the sequence 11 with 01, an aggregated distance equal to 5, the corresponding bit being 1, the sequence of decoded bits being 011,
  a distance of 1 by comparing the sequence 11 with 10, an aggregated distance equal to 5, the corresponding bit being 0, the sequence of decoded bits being 010.

Starting from the fourth other possible state 11, we have for column i=3:
  a distance equal to 1 by comparing the sequence 11 with 10, an aggregated distance equal to 2, the corresponding bit being 1, the sequence of decoded bits being 111,
  a distance of 1 by comparing the sequence 11 with 01, an aggregated distance equal to 2, the corresponding bit being 0, the sequence of decoded bits being 110.

From this fourth column of nodes (i=3), each state is reached by two paths. For example the state 00 can be reached from:
  the path whose states are 00, 00, 00, 00, with an aggregated distance equal to 4, the decoded sequence being 000, or
  the path whose states are 00, 10, 01, 00 with an aggregated distance equal to 1, the decoded sequence being 100.

Only the path whose aggregated distance is the smallest is retained (in fact lesser or equal but according to an alternative it would be possible to choose the strictly lesser distance); and the aggregated distance allocated to this state is then this smallest distance.

In this way, for this column i=3, we retain, for:
  the state 00, only the sequence 100 associated with the aggregated distance 1 (instead of 000 associated with the aggregated distance 4),
  the state 01, only the sequence 110 associated with the aggregated distance 2 (instead of 010 associated with the aggregated distance 5),
  the state 10, only the sequence 001 associated with the aggregated distance 2 (instead of 101 associated with the aggregated distance 3),
  the state 11, only the sequence 111 associated with the aggregated distance 2 (instead of 011 associated with the aggregated distance 5).

The method then proceeds between columns i=3 and i=4 and described in relation to FIGS. 7b, 7c. We retain for:
  the state 00, only the sequence 1100 associated with the aggregated distance 2 (instead of 1000 associated with the aggregated distance 3),
  the state 01, only the sequence 1110 associated with the aggregated distance 3,
  the state 10, only the sequence 1001 associated with the aggregated distance 1 (instead of 1101 associated with the aggregated distance 4),
  the state 11, only the sequence 0011 associated with the aggregated distance 3.

It is then possible to retrieve the initially sent sequence by starting from the state having the smallest aggregated distance, i.e. 1 in our example with the decoded sequence 1001

(which has been outlined in FIG. 7c), which is indeed the inverse of the sequence sent initially: the decoder has therefore retrieved the right sequence despite the error which was introduced on the symbols received.

The Viterbi decoder considered here is designed for a hardware implementation on a programmable logic circuit of ASIC or FPGA type, which makes it possible to optimize the hardware resources used (RAM, number of flip-flops, etc.).

On reception, as has just been seen in our example, a trellis is generated on the basis of the elementary lattice by recording:

on the arcs, the distance between the symbols received and the labels associated with the arc, on each node, the aggregated distance from the beginning The decoding state can be represented at any moment by the last column of the trellis with the 2K−1 surviving paths.

This method is implemented in the following manner. The decoder according to the invention comprises two memories which have the same organization, one being called a source memory, the other the destination memory and an operator which works in flip-flop mode on these two memories. The size of these memories is dimensioned according to the constraint length lc (corresponding to the "memory" of the decoder): they have 2lc words or rows. Each word must contain the following fields:

Destination address1 defined on lc bits,
Destination address2 defined on lc bits,
Address distance1 (or metric 1) defined on n bits,
Address distance2 (or metric2) defined on n bits,
Aggregated distance (or Total distance) defined on m bits, with n<m≦S+n,
Decoded sequence defined on S bits,
State indicator defined on 1 bit, Where:

n is the number of bits used to code the weighted decision,
S the maximum traceback depth desired.

According to embodiments of the present invention, the aggregated distance is the aggregated distance on the chosen path which, of the two possible paths, is the one with the smallest aggregated distance; it is calculated on the basis of the Euclidean distance between the symbol pair received and the label associated with the arc. Let x be the first symbol received and y the second, and x0 and y0 the ideal values; the Euclidean distance M is then of the form:

$$M=(x-x0)^2+(y-y0)^2$$

This distance is generally coded on 3 bits as indicated in the preamble.

The Decoded sequence is the concatenation of the set of decoded bits corresponding to the symbols constituting the chosen path, the number of these bits being called the "traceback" depth.

The State indicator (also called Flag hereinafter) indicates whether this row of the memory has already been processed, in which case "Aggregated distance" and "Decoded sequence" are rewritten only if a path having a smaller aggregated distance is found.

These three fields which vary in tandem with the arrival of the symbols, are updated on the basis of the elementary lattice of the trellis, that is to say on the basis of the following predefined fields:

the addresses in the destination memory (which is an image of this elementary lattice) of the two following permitted states, called destination address1, destination address2,
the two labels of the arcs corresponding to these permitted transitions, called address distance1 (or metric1) and address distance2 (or metric2).

The first four fields are fixed fields, that is to say previously defined on the basis of the elementary lattice of the trellis, which depends on the coding; the last three fields are fields which vary as the processing of the symbols received proceeds.

Figure 12:
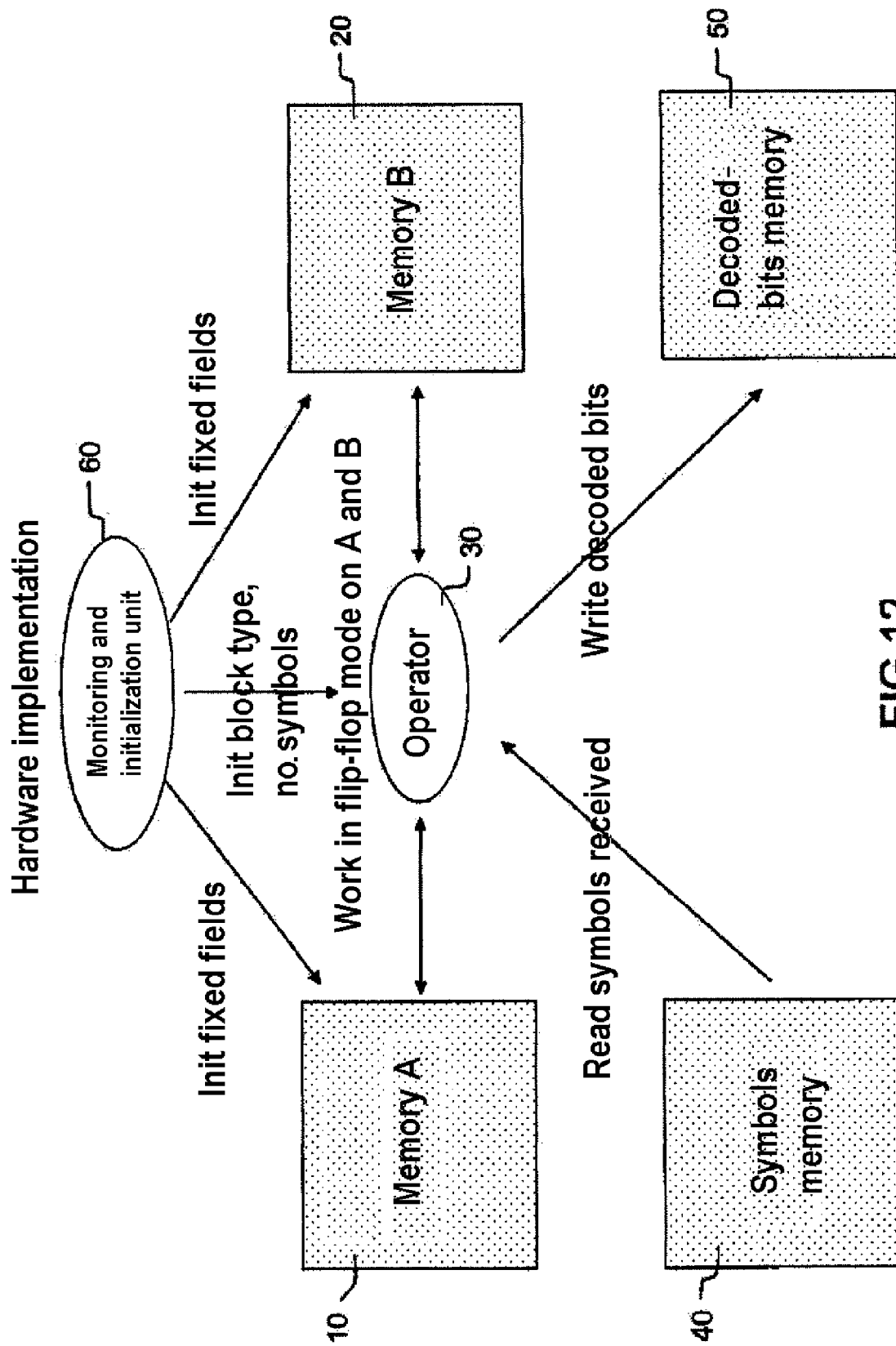

The processing is carried out by means of the implementation represented in FIG. 12 which comprises a source memory A 10, a destination memory B 20, which are interchangeable, and an operator 30 linked to these memories. According to a favored operating mode, this implementation comprises only these 2 memories 10, 20 and this operator 30.

In a conventional manner the symbols received originate from a symbols memory 40, the decoded bits are stored in a decoded-bits memory 50.

Figure 8A:
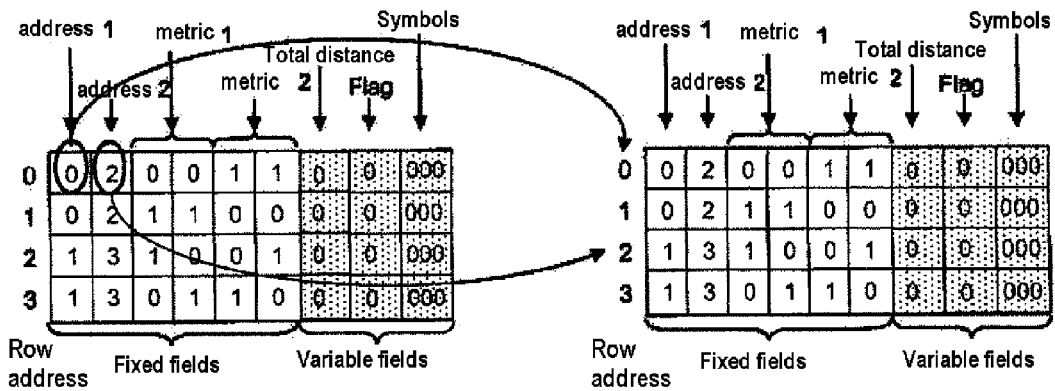
Figure 8B:
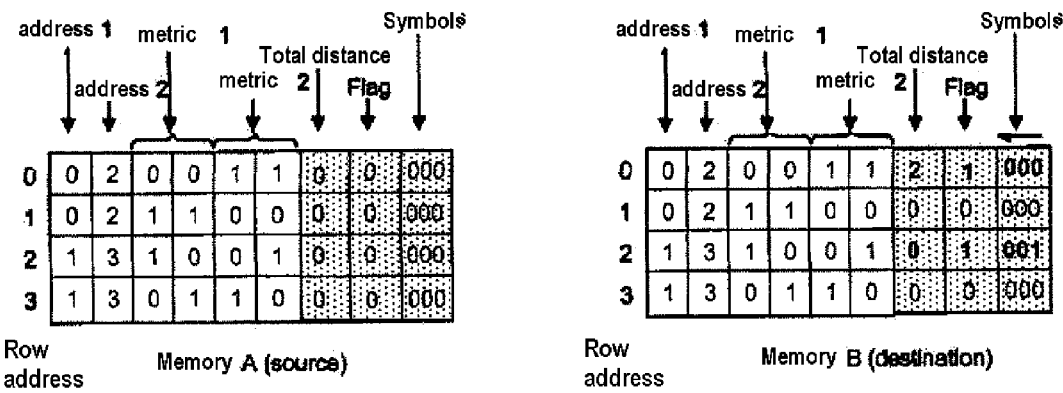
Figure 8C:
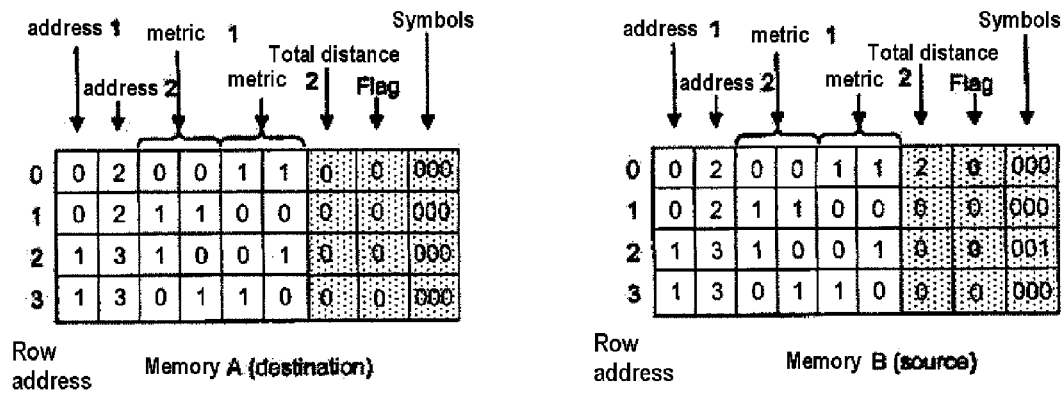

The processing consists in analyzing the set of symbols received from the memory 40 in real time or in non-real time and, for each symbol in traversing the source memory from row 0 to row $2^{lc-1}$ illustrated llustrated in FIGS. 8a to 8c.

For each address of the source memory 10 (representing a possible state of the encoder), two addresses of the destination memory 20 representing the two possible following states and the labels associated with these transitions are available.

In the destination memory, the operator 30 updates:

the aggregated distance as a function of the labels of the arcs of the elementary lattice and of the symbols received associated with the transitions, the path traversed, also called the decoded sequence, which is constructed from the concatenation of the symbols corresponding to the set of transitions traversed from the beginning of the decoding: this is a sequence of decoded bits (a pair of decoded symbols making it possible to find the bit sent). This path is filled from the top, by shifting the decoded bits already present towards the low weights. A multiplexer makes it possible to choose from which position of this sequence the decoded bits will be dispatched towards the output, that is to say towards the "result" memory, that is to say the memory of the decoded bits 50. This position corresponds to the depth of the reverse path also called the "traceback" depth.

The state indicator (or Flag) whose value reverses with each new symbol and the role of which is to signify that this row of the destination memory has been updated. This is useful since each destination is processed twice and a path that is worse than the path that may already be present in this box must not be written. This makes it possible to "cut off the branch" which is the worse of the two. This function can be ensured by another means that is not coded in the memory but which would be a state internal to the operator.

Once the rows (or words) of the source memory 10 are exhausted, the operator 30 dispatches the calculated bit to the decoded-bits memory 50, resets the aggregated distances to avoid an overflow of the "aggregated-distance" field, reinitializes the indicators, reverses the role of the memories and passes to the following pair of symbols until concurrence of the number of symbols indicated by a monitoring and initialization unit 60 or else for as long as symbols arrive in real time.

According to a favored variant of the invention, after having processed a new symbol, the operator 30 determines the minimum distance from among all those found while processing a symbol and subtracts it from all the calculated distances, doing so in order to prevent the distances from overflowing. The aggregated distance is so to speak "filed down".

At the commencement of the decoding method, the operator 30 is initialized by command of the monitoring and initialization unit 60, with the aid of the following parameters:

number of symbols to be processed (for block-wise processing) or choice of the real-time mode, type of processing (first block, intermediate block or last block).

The memories 10, 20 are initialized by the monitoring and initialization unit 60 with the labels of the arcs associated with each node of the trellis, derived from the elementary lattice, that is to say the values of the polynomials G1 and G2 to be used.

More precisely, the following fields of each of the 2 memories are initialized in the following manner:

Destination address1 (or address 1): with the values derived from the polynomials G1 and G2, Destination address2 (or address 2): with the values derived from the polynomials G1 and G2, Add distance1 (or metric 1): with the labels associated with the arcs of the trellis, Add distance2 (or metric 2): with the labels associated with the arcs of the trellis, Aggregated distance: to 0

Decoded sequence: to 0

State indicator (or "flag"): to 0

This is illustrated in FIG. 8a in which the rows corresponding to the memory addresses are numbered in accordance with numerical convention from 0 to 3, 0 being associated with the state 00, 1 with the state 01, 2 with the state 10 and 3 with the state 11.

The procedure of the method on these two memories is illustrated in relation to FIGS. 8b to 8c, applying it to our example. The Hamming distance, which is equal to the number of different bits (i.e. 0, 1 or 2 for a 2-bit state) and which applies to a firm decision ("hard decision") decoder, is used as distance.

The processing of the first symbol received is the simplest since the starting state being known, it limits the assumptions.

The reception of the first symbol, i.e. the pair 11, is firstly considered.

"Reception of the 1st symbol 11; processing of row 0":

Within this framework, the two addresses of row 0 (FIG. 8b) are firstly processed: steps 1 to 5 for address 1, steps 6 to 11 for address 2.

1. The total distance corresponding to address 1 of row 0 of the source memory is calculated:
2. Total distance (B,address1(A,0))=Total distance (A,0)+ abs {symbol received−metric1(A,0)}
   i.e.: Total distance (B,0))=0+abs({1;1}−{0;0})=2
3. The value of the flag at the address of the destination memory is checked to ensure that it has not already been written during this cycle
   Flag(B,0)=0: not yet written:
4. The value of the flag is changed to say that the address has already been updated: Flag(B,0)=1. The total distance is updated in the destination memory: Total distance (B,0))=2
5. The sequence of decoded bits of the destination memory is updated with the corresponding value: Symbols(B, 0)=Symbols(A,0) shifted to the left+k (k=0 for address1 since this is the bit 0, k=1 for address2 since this is the bit 1, which convention will be retained hereinafter).
6. The total distance corresponding to address 2 of row 0 of the source memory is calculated:
7. Total distance (B,address2(A,0))=Total distance (A,0)+ abs{symbol received−metric2(A,0)}
   i.e.: Total distance (B,2))=0+abs({1;1}−{1;1})=0

8. The value of the flag at the address of the destination memory is checked to ensure that it has not already been written during this cycle
   Flag(B,2)=0: not yet written:
10. The value of the flag is changed to say that the address has already been updated: Flag(B,2)=1. The total distance is updated in the destination memory: Total distance (B,2))=0.
11. The sequence of decoded bits of the destination memory is updated with the corresponding value: Symbols(B,2)=Symbols(A,0) shifted to the left+k.

Since this is the first symbol received and as the initial state of the decoder is 0 (by assumption), the following rows are not processed (we start from a single known state). The following step is:

"End of processing of the 1st symbol received 11" (FIG. 8c).

1. The distances are normalized so as to avoid an overflow: the lowest distance value (0) is deducted from all the distances of the destination memory.
2. The role of the source and destination memories is reversed.
3. All the flags are reset to 0.

The processing of the second symbol received, i.e. the pair 00, is then considered. Within this framework, row 0 is processed first, followed by row 2.

Figure 9A:
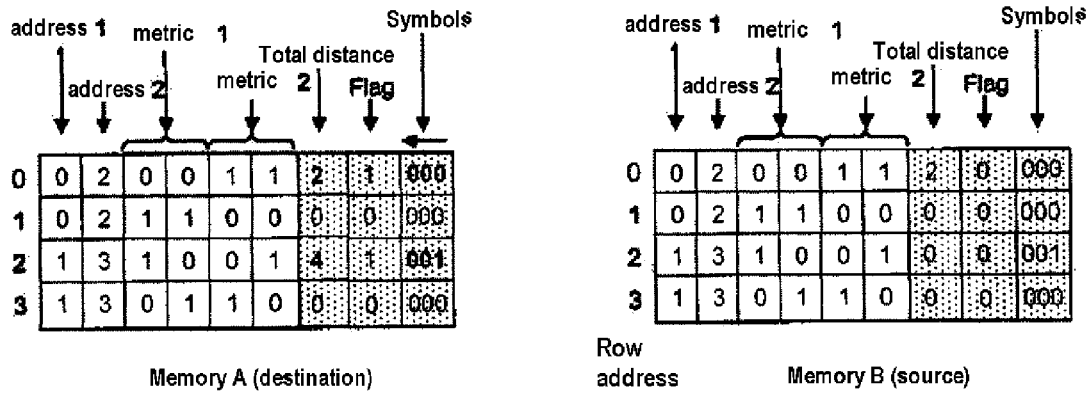

"Reception of the 2nd symbol 00; processing of row 0":

The two addresses of row 0 (FIG. 9a) are processed: steps 1 to 5 for address 1, steps 6 to 11 for address 2.

1. The total distance corresponding to address 1 of row 0 of the source memory is calculated:
2. Total distance (A,address1(B,0))=Total distance (B,0)+ abs{symbol received−metric1(B,0)}
   i.e.: Total distance (A,0))=2+abs({0;0}−{0;0})=2
3. The value of the flag at the address of the destination memory is checked to ensure that it has not already been written during this cycle
   Flag(A,0)=0: not yet written:
4. The value of the flag is changed to say that the address has already been updated: Flag(A,0)=1. The total distance is updated in the destination memory: Total distance (A,0))=2
5. The sequence of decoded bits of the destination memory is updated with the corresponding value: Symbols(A, 0)=Symbols(B,0) shifted to the left+k.
6. The total distance corresponding to address 2 of row 0 of the source memory is calculated:
7. Total distance (A,address2(B,0))=Total distance (B,0)+ abs{symbol received−metric2(B,0)}
   i.e.: Total distance (A,2))=2+abs({0;0}−{1;1})=4
8. The value of the flag at the address of the destination memory is checked to ensure that it has not already been written during this cycle
   Flag(A,2)=0: not yet written:
9. The value of the flag is changed to say that the address has already been updated: Flag(A,2)=1. The total distance is updated in the destination memory: Total distance (A,2))=4.
10. The sequence of decoded bits of the destination memory is updated with the corresponding value: Symbols(A,2)=Symbols(B,0) shifted to the left+k.

Figure 9B:
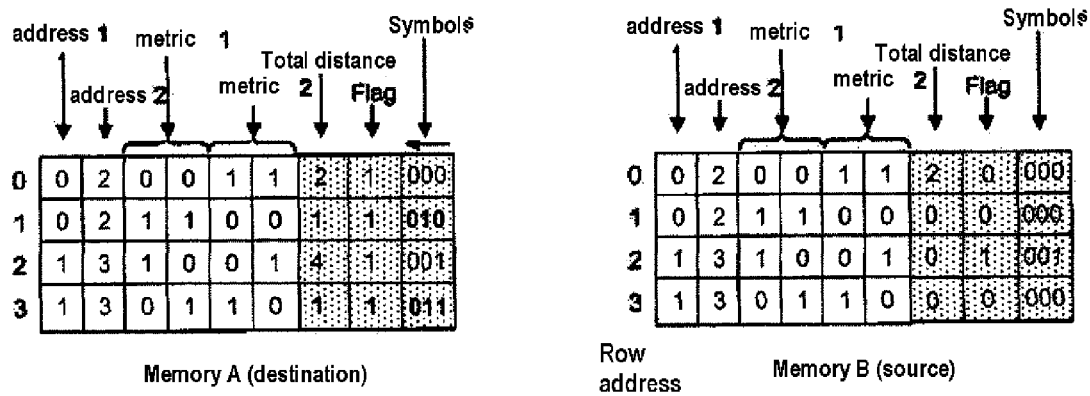

The two addresses of row 2 (FIG. 9b) are processed: steps 1 to 5 for address 1, steps 6 to 11 for address 2.

"Reception of the 2nd symbol 00; processing of row 2":

1. The total distance corresponding to address 1 of row 2 of the source memory is calculated:
2. Total distance (A,address1(B,2))=Total distance (B,2)+ abs {symbol received−metric1(B,2)}
   i.e.: Total distance (A,1))=0+abs({0;0}−{1;0})=1

3. The value of the flag at the address of the destination memory is checked to ensure that it has not already been written during this cycle Flag(A,1)=0: not yet written:

4. The value of the flag is changed to say that the address has already been updated: Flag(A,1)=1. The total distance is updated in the destination memory: Total distance (A,1))=1.

5. The sequence of decoded bits of the destination memory is updated with the corresponding value: Symbols(A, 1)=Symbols(B,2) shifted to the left+k.

6. The total distance corresponding to address 2 of row 2 of the source memory is calculated:

7. Total distance (A,address2(B,2))=Total distance (B,2)+ abs{symbol received−metric2(B,2)} i.e.: Total distance (A,3))=0+abs({0;0}−{0;1})=1

8. The value of the flag at the address of the destination memory is checked to ensure that it has not already been written during this cycle Flag(A,3)=0: not yet written:

9. The value of the flag is changed to say that the address has already been updated: Flag(A,3)=1. The total distance is updated in the destination memory: Total distance (A,3))=1

10. The sequence of decoded bits of the destination memory is updated with the corresponding value: Symbols(A,3)=Symbols(B,2) shifted to the left+k.

Since this is the second symbol received and as the initial state of the decoder was 0 (by assumption), the other 2 rows, which are not valid assumptions, are not processed.

Figure 9C:
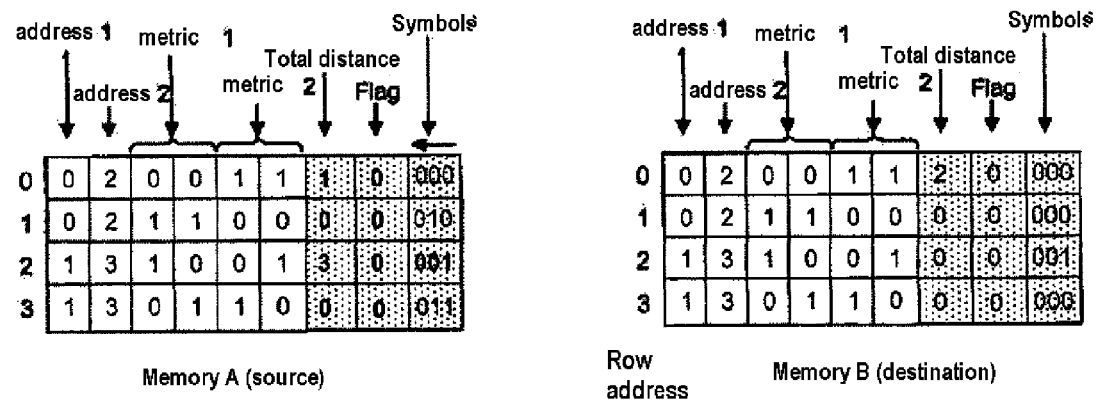

"End of processing of the 2nd symbol 00" (FIG. 9*c*).

1. The distances are normalized so as to avoid an overflow: the lowest distance value (1) is deducted from all the distances of the destination memory.

2. The role of the source and destination memories is reversed.

3. All the flags are reset to 0.

The processing of the third symbol received, i.e. the pair 11, is then considered. Within this framework, the four rows are processed successively.

Figure 10A:
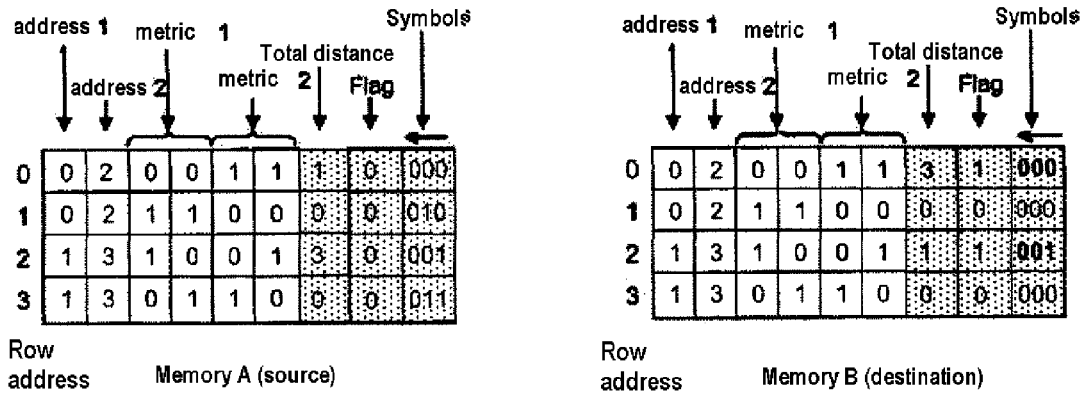

"Reception of the 3rd symbol 11; processing of row 0": (FIG. 10*a*):

1. The total distance corresponding to address 1 of row 0 of the source memory is calculated:

2. Total distance (B,address1(A,0))=Total distance (A,0)+ abs {symbol received-metric1(A,0)} i.e.: Total distance (B,0))=1+abs({1;1}−{0;0})=3

3. The value of the flag at the address of the destination memory is checked to ensure that it has not already been written during this cycle Flag(B,0)=0: not yet written:

4. The value of the flag is changed to say that the address has already been updated: Flag(B,0)=1. The total distance is updated in the destination memory: Total distance (B,0))=3.

5. The sequence of decoded bits of the destination memory is updated with the corresponding value: Symbols(B,0)=Symbols(A,0) shifted to the left+k.

6. The total distance corresponding to address 2 of row 0 of the source memory is calculated:

7. Total distance (B,address2(A,0))=Total distance (A,0)+ abs{symbol received−metric2(A,0)} i.e.: Total distance (B,2))=1+abs({1;1}−{1;1})=1

8. The value of the flag at the address of the destination memory is checked to ensure that it has not already been written during this cycle Flag(B,0)=0: not yet written:

9. The value of the flag is changed to say that the address has already been updated: Flag(B,0)=1. The total distance is updated in the destination memory: Total distance (B,2))=1.

10. The sequence of decoded bits of the destination memory is updated with the corresponding value: Symbols(B,2)=Symbols(A,0) shifted to the left+k.

Figure 10B:
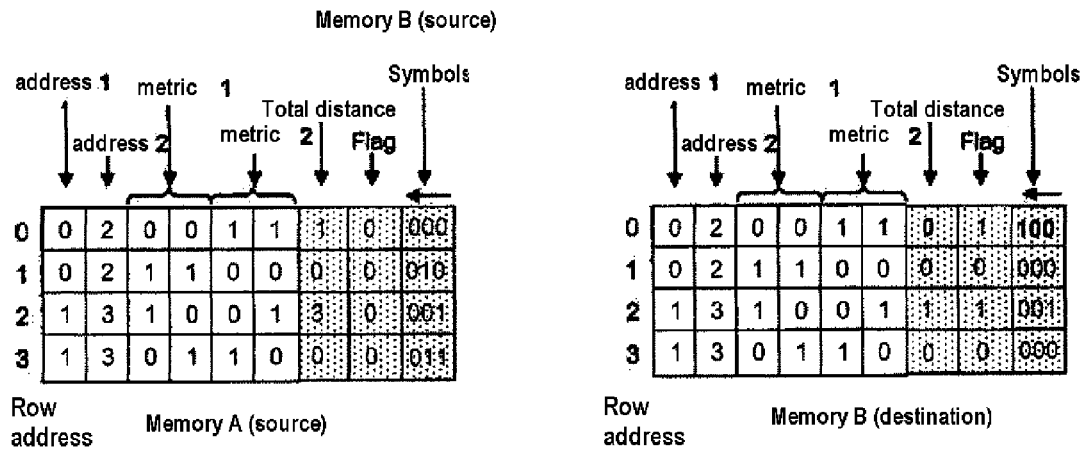

"Reception of the 3rd symbol 11; processing of row 1": (FIG. 10*b*):

1. The total distance corresponding to address 1 of row 1 of the source memory is calculated:

2. Total distance (B,address1(A,1))=Total distance (A,1)+ abs{symbol received−metric1(A,1)} i.e.: Total distance (B,0))=0+abs({1;1}−{1;1})=0

3. The value of the flag at the address of the destination memory is checked to ensure that it has not already been written during this cycle Flag(B,0)=1: already written. The calculated distance (0) is less than the stored distance (3) therefore the latter is updated:

Total distance (B,0))=0.

4. The sequence of decoded bits of the destination memory is updated with the corresponding value: Symbols(B,0)=Symbols(A,1) shifted to the left+k.

5. The total distance corresponding to address 2 of row 1 of the source memory is calculated:

6. Total distance (B,address2(A,1))=Total distance (A,1)+ abs{symbol received−metric2(A,1)} i.e.: Total distance (B,2))=0+abs({1;1}−{0;0})=2

7. The value of the flag at the address of the destination memory is checked to ensure that it has not already been written during this cycle Flag(B,2)=1: already written: The calculated distance (2) is greater than the stored distance (1) therefore the latter is not updated.

The sequence of decoded bits of the destination memory is not updated.

Figure 10C:
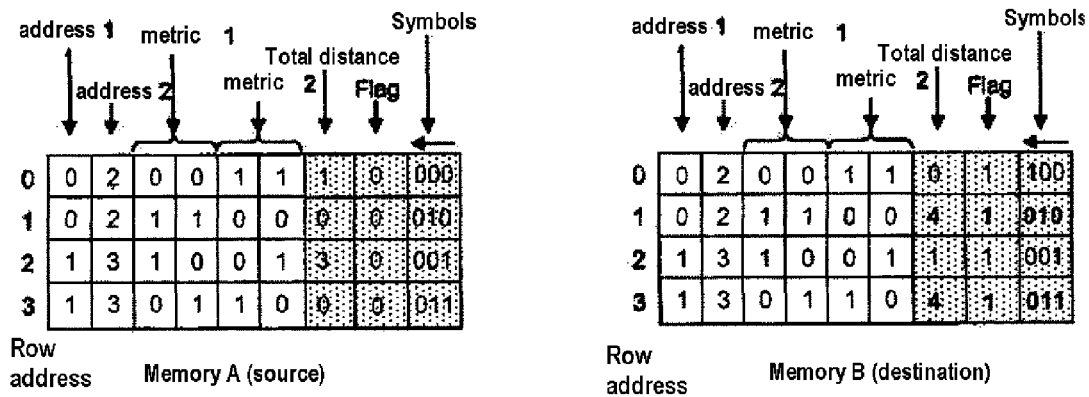

"Reception of the 3rd symbol 11; processing of row 2": (FIG. 10*c*):

1. The total distance corresponding to address 1 of row 2 of the source memory is calculated:

2. Total distance (B,address1(A,2))=Total distance (A,2)+ abs{symbol received−metric1(A,2)} i.e.: Total distance (B,1))=3+abs({1;1}−{1;0})=4

3. The value of the flag at the address of the destination memory is checked to ensure that it has not already been written during this cycle Flag(B,1)=0: not yet written:

4. The value of the flag is changed to say that the address has already been updated: Flag(B,1)=1. The total distance is updated in the destination memory: Total distance (B,1))=4.

5. The sequence of decoded bits of the destination memory is updated with the corresponding value: Symbols(B,1)=Symbols(A,2) shifted to the left+k.

6. The total distance corresponding to address 2 of row 2 of the source memory is updated:

7. Total distance (B,address2(A,2))=Total distance (A,2)+ abs{symbol received−metric2(A,2)} i.e.: Total distance (B,3))=3+abs({1;1}−{0;1})=4

8. The value of the flag at the address of the destination memory is checked to ensure that it has not already been written during this cycle
   Flag(B,3)=0: not yet written.
9. The value of the flag is changed to say that the address has already been updated: Flag(B,3)=1. The total distance is updated in the destination memory: Total distance (B,3))=4.
10. The sequence of decoded bits of the destination memory is updated with the corresponding value: Symbols(B,3)=Symbols(A,2) shifted to the left+k.

Figure 10D:
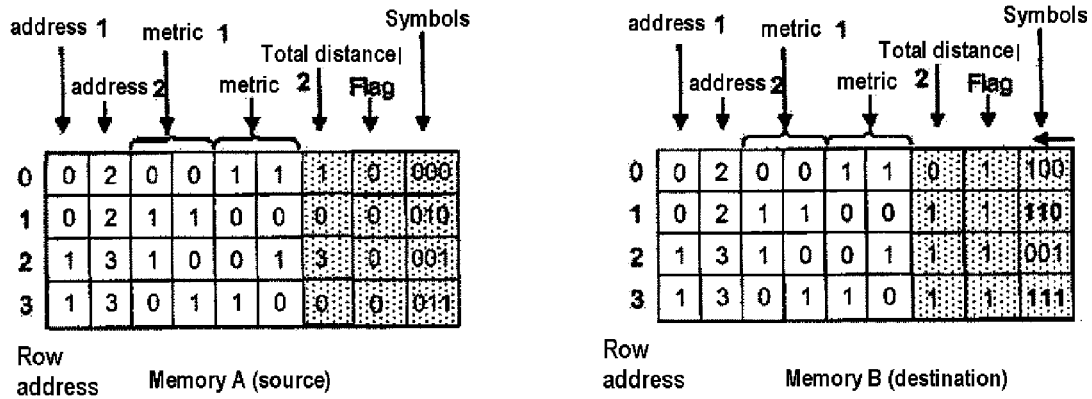

"Reception of the 3rd symbol 11; processing of row 3": (FIG. 10d):
1. The total distance corresponding to address 1 of row 3 of the source memory is calculated:
2. Total distance (B,address1(A,3))=Total distance (A,3)+ abs {symbol received−metric1(A,3)}
   i.e.: Total distance (B,1))=0+abs({1;1}−{0;1})=1
3. The value of the flag at the address of the destination memory is checked to ensure that it has not already been written during this cycle
   Flag(B,1)=1: already written. The calculated distance (1) is less than the stored distance (4) therefore the latter is updated:
   Total distance (B,1))=1.
4. The sequence of decoded bits of the destination memory is updated with the corresponding value: Symbols(B,1)=Symbols(A,3) shifted to the left+k.
6. The total distance corresponding to address 2 of row 3 of the source memory is calculated:
7. Total distance (B,address2(A,3))=Total distance (A,3)+ abs{symbol received−metric2(A,3)}
   i.e.: Total distance (B,3))=0+abs({1;1}−{1;0})=1
8. The value of the flag at the address of the destination memory is checked to ensure that it has not already been written during this cycle.
   Flag(B,3)=1 already written. The calculated distance (1) is less than the stored distance (4) therefore the latter is updated:
   Total distance (B,3))=1.
9. The sequence of decoded bits of the destination memory is updated with the corresponding value: Symbols(B,3)=Symbols(A,3) shifted to the left+k.

Figure 10E:
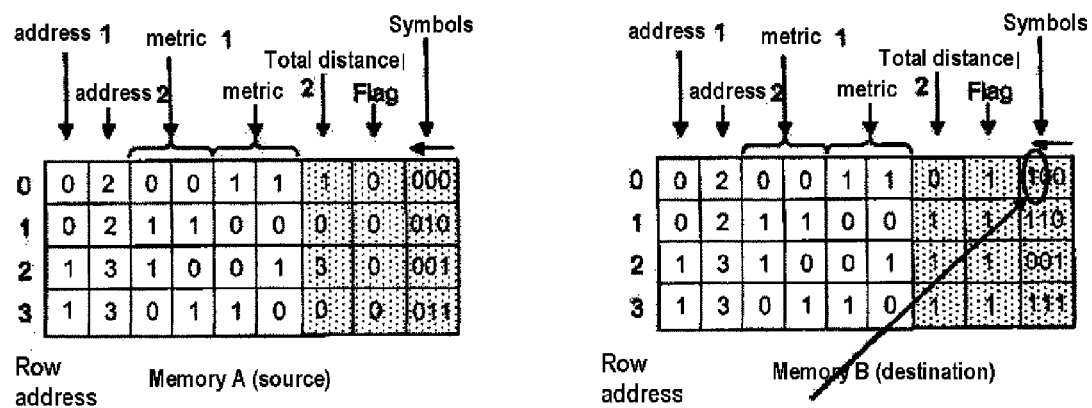
Figure 10F:
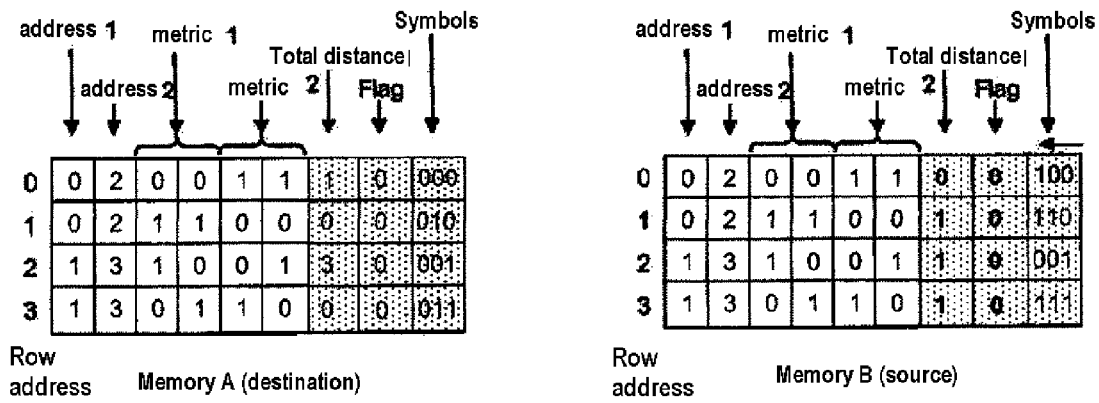

"End of the processing of the 3rd symbol 11" (FIG. 10e):
1. Having reached the traceback depth (3 bits), the bit corresponding to the row of the destination memory having the lowest total distance is output to the decoded-bits memory; here this is row 0 (distance 1) and the oldest bit (1). It corresponds to the first bit actually sent by the sender.
2. The distances are normalized so as to avoid an overflow: the lowest distance value (here 0) is deducted from all the distances of the destination memory.
3. The role of the source and destination memories is reversed.
4. All the flags are reset to 0.

The processing of the fourth symbol received, i.e. the pair 11, is then considered. Within this framework, the four rows are processed successively.

Figure 11A:
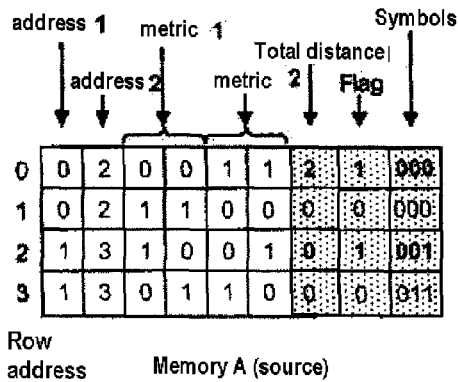
Figure 11A:
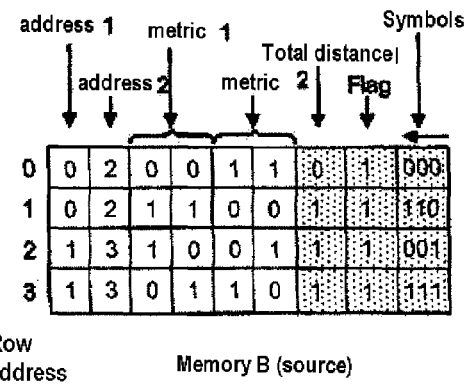

"Reception of the 4th symbol 11; processing of row 0": (FIG. 11a):
1. The total distance corresponding to address 1 of row 0 of the source memory is calculated:
2. Total distance (A,address1(B,0))=Total distance (B,0)+ abs{symbol received −metric1(B,0)}
   i.e.: Total distance (A,0))=0+abs({1;1}−{0;0})=2
3. The value of the flag at the address of the destination memory is checked to ensure that it has not already been written during this cycle
   Flag(A,0)=0: not yet written:
4. The value of the flag is changed to say that the address has already been updated: Flag(A,0)=1. The total distance is updated in the destination memory: Total distance (A,0))=2.
5. The sequence of decoded bits of the destination memory is updated with the corresponding value: Symbols(A,0)=Symbols(B,0) shifted to the left+k.
6. The total distance corresponding to address 2 of row 0 of the source memory is calculated:
7. Total distance (A,address2(B,0))=Total distance (B,0)+ abs{symbol received−metric2(B,0)}
   i.e.: Total distance (A,2))=0+abs({1;1}−{1;1})=0
8. The value of the flag at the address of the destination memory is checked to ensure that it has not already been written during this cycle
   Flag(A,0)=0: not yet written:
9. The value of the flag is changed to say that the address has already been updated: Flag(A,0)=1. The total distance is updated in the destination memory: Total distance (A,2))=0.
10. The sequence of decoded bits is updated with the corresponding value: Symbols(A,2)=Symbols(B,0) shifted to the left+k.

Figure 11B:
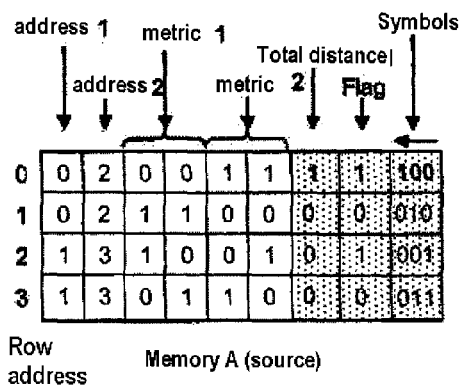
Figure 11B:
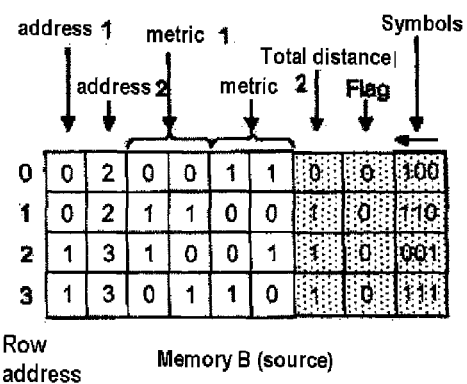

"Reception of the 4th symbol 11; processing of row 1": (FIG. 11b):
1. The total distance corresponding to address 1 of row 1 of the source memory is calculated:
2. Total distance (A,address1(B,1))=Total distance (B,1)+ abs {symbol received−metric1(B,1)}
   i.e.: Total distance (A,0))=1+abs({1;1}−{1;1})=1
3. The value of the flag at the address of the destination memory is checked to ensure that it has not already been written during this cycle
   Flag(A,0)=1: already written. The calculated distance (1) is less than the stored distance (2) therefore the latter is updated:
   Total distance (A,0))=1.
4. The sequence of decoded bits of the destination memory is updated with the corresponding value: Symbols(A,0)=Symbols(B,1) shifted to the left+k.
5. The total distance corresponding to address 2 of row 1 of the source memory is calculated:
6. Total distance (A,address2(B,1))=Total distance (B,1)+ abs{symbol received−metric2(B,1)}
   i.e.: Total distance (A,2))=1+abs({1;1}−{0;0})=3
7. The value of the flag at the address of the destination memory is checked to ensure that it has not already been written during this cycle
   Flag(A,2)=1: already written: The calculated distance (3) is greater than the stored distance (0) therefore the latter is not updated.
The sequence of decoded bits of the destination memory is not updated.

Figure 11C:
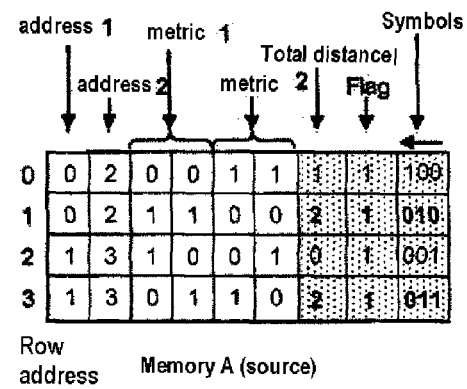
Figure 11C:
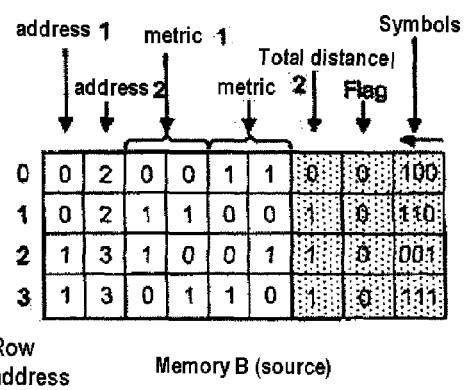

"Reception of the 4th symbol 11; processing of row 2": (FIG. 11c):
1. The total distance corresponding to address 1 of row 2 of the source memory is calculated:
2. Total distance (A,address1(B,2))=Total distance (B,2)+ abs {symbol received−metric1(B,2)}
   i.e.: Total distance (A,1))=1+abs({1;1}−{1;0})=2

3. The value of the flag at the address of the destination memory is checked to ensure that it has not already been written during this cycle
   Flag(A,1)=0: not yet written:
4. The value of the flag is changed to say that the address has already been updated: Flag(A,1)=1. The total distance is updated in the destination memory: Total distance (A,1))=2.
5. The sequence of decoded bits of the destination memory is updated with the corresponding value: Symbols(A,1)=Symbols(B,2) shifted to the left+k.
6. The total distance corresponding to address 2 of row 2 of the source memory is calculated:
7. Total distance (A,address2(B,2))=Total distance (B,2)+abs {symbol received−metric2(B,2)}
   i.e.: Total distance (A,3))=1+abs({1;1}−{0;1})=2
8. The value of the flag at the address of the destination memory is checked to ensure that it has not already been written during this cycle
   Flag(A,3)=0: not yet written
9. The value of the flag is changed to say that the address has already been updated: Flag(A,3)=1. The total distance is updated in the destination memory: Total distance (A,3))=2.
10. The sequence of decoded bits of the destination memory is updated with the corresponding value: Symbols(A,3)=Symbols(B,2) shifted to the left+k.

Figure 11D:
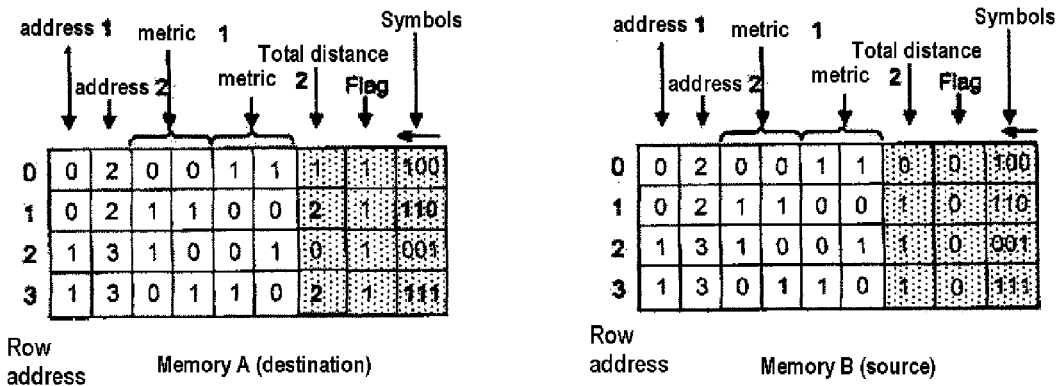

"Reception of the 4th symbol 11; processing of row 3": (FIG. 11*d*):
1. The total distance corresponding to address 1 of row 3 of the source memory is calculated:
2. Total distance (A,address1(B,3))=Total distance (B,3)+abs {symbol received−metric1(B,3)}
   i.e.: Total distance (A,1))=1+abs({1;1}−{0;1})=2
3. The value of the flag at the address of the destination memory is checked to ensure that it has not already been written during this cycle
   Flag(A,1)=1: already written. The calculated distance (2) is less than (or equal to) the stored distance (2) therefore the latter is updated:
   Total distance (A,1))=2.
4. The sequence of decoded bits of the destination memory is updated with the corresponding value: Symbols(A,1)=Symbols(B,3) shifted to the left+k.
6. The total distance corresponding to address 2 of row 3 of the source memory is calculated:
7. Total distance (A,address2(B,3))=Total distance (B,3)+abs{symbol received−metric2(B,3)}
   i.e.: Total distance (A,3))=1+abs({1;1}−{1;0})=2
8. The value of the flag at the address of the destination memory is checked to ensure that it has not already been written during this cycle
   Flag(A,3)=1 already written. The calculated distance (2) is less than (or equal to) the stored distance (2) therefore the latter is updated:
   Total distance (A,3))=2.
9. The sequence of decoded bits is updated with the corresponding value:
   Symbols(A,3)=Symbols(B,3) shifted to the left+k.

Figure 11E:
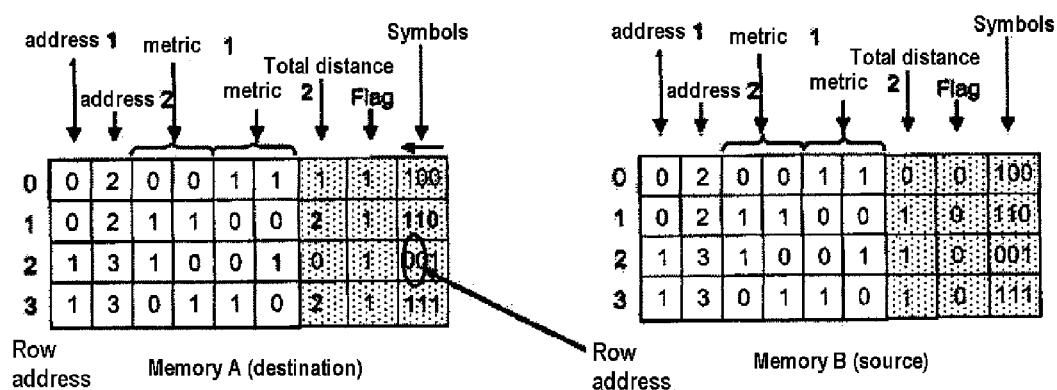
Figure 11F:
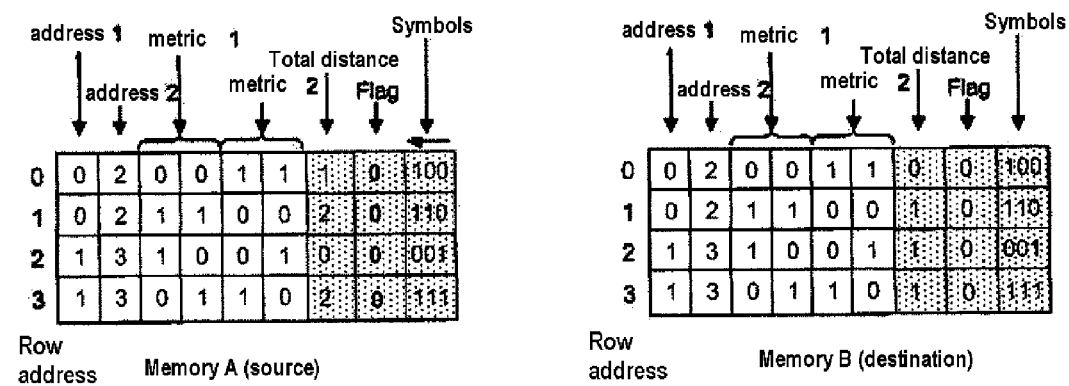

"End of processing of the 4th symbol 11":
1. Having reached the traceback depth (3 bits), the bit corresponding to the row of the destination memory having the lowest total distance is output to the decoded-bits memory. Here this is row 2 (distance 0) and the oldest bit (0). It corresponds to the second bit actually sent by the sender. The series of the other bits sent (0 0 1) is retrieved in this branch.
2. The distances are normalized so as to avoid an overflow: the lowest distance value (here 0) is deducted from all the distances.
3. The role of the source and destination memories is reversed.
4. All the flags (FIG. 11*e*) are reset to 0.

The generic processing process implemented by the operator is now presented.
Initialization of the memories;
For each symbol received:
   For each row (i) of the source matrix:
      For each of the two address fields (j=1 or 2),
         Calculate the new total distance with the formula:

New Distance=Total distance(source,*i*)+abs{symbol received−metric*j*(source,*i*)}, Check the value of Flag (destination,address*j*(source,i)),
         If this value equals 0 then
            update the total distance of the row of the destination memory,
            Total distance(destination,address*j*(source,i))=New Distance,
            Change the value of the flag to say that the address has already been updated,
            Update the sequence of decoded bits with the corresponding value:

Symbols(destination, address*j*(source,*i*)))=(Symbols (source,*i*)<<1)+0,

If this value equals 1 then
            If Total distance(destination,address1(source,i)) <=New Distance Do nothing,
            Else
               update the total distance of the row of the destination memory,
               Total distance(destination,address*j*(source, i))=New Distance,
               Change the value of the flag to say that the address has already been updated,
               Update the sequence of decoded bits with the corresponding value:

Symbols(destination, address*j*(source,*i*)))=(Symbols (source,*i*)<<1)+1,

At the end of the processing of a symbol:
   Set all the flags to 0,
   Reset the distances calculated to scale,
   Output the bit having concluded the traceback corresponding to the row with the lowest distance,
   Reverse source memory and destination memory.

If this is a block-wise processing, the processing of a first block termed the initialization block, whose symbols are known a priori, initializes the destination memory 50. The processing of an intermediate block takes account of the distances calculated during the processing of the previous block. The processing of a final block uses the presence of the "tail" bits (6 zeros at the end of the message) to delete certain paths at the end of the processing.

The traceback depth can be parameterized up to a limit equal to the length S of the "Decoded sequence" field in the destination memory 20.

This original implementation of the Viterbi decoder adapted to GNSS signals makes it possible to limit the hardware resources to two memories 10 and 20 together with an operator 30.

This solution allows the embedding of this type of decoder in aeronautical receivers directly in the ASIC or the FPGA dedicated to the signal processing.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A receiver of a digital signal equipped with an N-state weighted-decision trellis Viterbi decoder, the trellis being established on the basis of an elementary trellis comprising N starting states and N finishing states, each starting state being linked to two finishing states by labeled arcs, the signal received including a series of symbols, the receiver comprising:
a programmable logic circuit, including:
a source memory A and a destination memory B each comprising N rows and M+L columns respectively allocated to M fixed fields for describing the trellis, and to L variable fields, the fixed fields comprising at least two destination address fields, one per finishing state and two fields of labels of the corresponding arcs, the variable fields comprising at least one field of distance aggregated as a function of the labels of the elementary lattice and of the symbols received, and a sequence field of the S last decoded bits; and
an operator able to calculate the variable fields of a memory as a function of the fixed fields of the said memory, of the symbols received and of the variable fields of the other memory and able to reverse the role of the source memory and destination memory.

2. The receiver according to claim 1, wherein N is equal to $2^{lc}$, lc is the constraint length of the coder, and the destination addresses are defined on lc bits.

3. The receiver according to claim 1, wherein M=4 and L=2 or 3.

4. The receiver according to claim 1, wherein the weighted decision is coded on n bits, and the labels are defined on n bits.

5. The receiver according to claim 1, wherein the aggregated distance is defined on m bits with $n<m\leq S+n$.

6. The receiver according to claim 1, wherein the variable fields comprise a field indicating, for each row of the memory, whether the aggregated distance has already been calculated for the symbol received.

7. The receiver according to claim 1, wherein the indicator field is defined on one bit.

8. The receiver according to claim 1, wherein the receiver is a GNSS receiver.

9. A method for receiving a digital signal by means of a receiver according to claim 1, comprising:
a decoding step including a step of processing each symbol received that includes, for each row of the source memory, the following sub-steps for each of the two addresses of this row:
calculation by the operator of the distance between the symbol received and the label of the label field associated with this address,
calculation by the operator of the aggregated distance from the destination memory to this address on the basis of the distance and of the aggregated distance of the row of the source memory, this aggregated distance, termed last aggregated distance, being associated with a decoded sequence, and
if an aggregated distance, termed previous aggregated distance, has already been calculated at this address, choosing by the operator for this address the smallest aggregated distance between this previous aggregated distance and the last aggregated distance, and updating of the sequence decoded by the sequence associated with the chosen aggregated distance.

10. The method for receiving a digital signal according to claim 9, wherein at the end of the step of processing the symbol received, the role of the source memory and destination memory is reversed by the operator.

11. The method for receiving a digital signal according to claim 10, wherein the smallest aggregated distance is subtracted from all the aggregated distances.

12. The method for receiving a digital signal according to claim 9, wherein at the end of the step of processing the symbol received, the aggregated distance of each row of the destination memory is normalized to avoid an overflow of the aggregated-distance field.

13. The method for receiving a digital signal according to claim 9 by means of the receiver according to claim 6, wherein the value of the indicator of the indicator field reverses when the aggregated distance has already been calculated and in that at the end of the step of processing a symbol received, this indicator is reinitialized for each row of the memory.

* * * * *